(12) United States Patent   (10) Patent No.: US 7,629,845 B2
Kao   (45) Date of Patent: Dec. 8, 2009

(54) AMPLIFIER AND SYSTEM UTILIZING THE SAME

(75) Inventor: Peng-Feng Kao, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 21 days.

(21) Appl. No.: 11/822,360

(22) Filed: Jul. 5, 2007

(65) Prior Publication Data

US 2008/0252374 A1    Oct. 16, 2008

(30) Foreign Application Priority Data

Apr. 13, 2007   (TW) .............................. 96205925 U

(51) Int. Cl.
*H03F 3/45* (2006.01)
(52) U.S. Cl. ...................................... 330/253
(58) Field of Classification Search ................. 330/253, 330/255, 257
See application file for complete search history.

(56) References Cited

U.S. PATENT DOCUMENTS 5,703,532 A * 12/1997 Shin et al. .................... 330/253
2003/0141935 A1 * 7/2003 Chen et al. .................. 330/301

* cited by examiner

*Primary Examiner*—Robert Pascal
*Assistant Examiner*—Khiem D Nguyen
(74) *Attorney, Agent, or Firm*—Muncy, Geissler, Olds & Lowe, PLLC

(57) ABSTRACT

An amplifier structure is disclosed. The amplifier comprises a voltage source, a first amplifying unit and a second amplifying unit. The first amplifying unit is coupled to the voltage source to amplify a first input signal and a second input signal to generate a first amplified signal according to a bias current and a reference current. The second amplifying unit is coupled to the voltage source and the first amplifying unit to amplify the first input signal and the second input signal to generate a second amplified signal according to the bias current and the reference current, wherein the amplifier generates an output signal according to the first amplified signal and the second amplified signal.

15 Claims, 2 Drawing Sheets

US 7,629,845 B2

AMPLIFIER AND SYSTEM UTILIZING THE SAME

BACKGROUND OF THE INVENTION

1. Field of the Invention

The invention relates to an amplifier, and more particularly, to an amplifier capable of compensating offset voltage thereof.

2. Description of the Related Art

Conventional amplifiers comprise two input terminals and one output terminal. The amplifier is supplied with direct current (DC) from two DC power sources. In operation, the amplifier measures the difference between voltages of two input terminals and multiples the difference with a gain to generate a voltage in the output terminal. Ideally, the input terminals are assumed to have very high impedance so minimal current flow into or out of the input terminals. Therefore, the signal current of the two input terminals are assumed to be zero, such that output impedance approaches an infinite level.

Consequently, an operational amplifier only responds to a signal difference between voltages of the two input terminals with no consideration of the common part therebetween. That is, the output is assumed to be zero when the two input voltages are the same, referred to as common mode rejection. Gain between the two input terminals is referred to as differential gain, which retains a constant value in a frequency range from zero to infinity. Ideally, an ideal operational amplifier amplifies any frequency with the same gain value. However, the offset voltage of the operational amplifier will not be zero, being influenced by process drift, element matching, or others.

In a digital to analog converter, once the operational amplifier has an offset voltage, the signal is distorted, and unexpected effects can be applied to the circuit coupled behind the operational amplifier. Particularly, the operational amplifier cannot have an offset voltage when measuring a small signal, since the voltage of the signal source itself is small. Therefore, it is important to eliminate the offset voltage for the operational amplifier without increasing circuit area and power consumption.

BRIEF SUMMARY OF THE INVENTION

An amplifier structure is disclosed. The amplifier structure comprises a voltage source, a first amplifying unit and a second amplifying unit. The first amplifying unit is coupled to the voltage source to amplify a first input signal and a second input signal to generate a first amplified signal according to a bias current and a reference current. The second amplifying unit is coupled to the voltage source and the first amplifying unit to amplify the first input signal and the second input signal to generate a second amplified signal according to the bias current and the reference current, wherein the amplifier generates an output signal according to the first amplified signal and the second amplified signal.

An amplifier system is further disclosed, comprising a voltage source, a bias module, an amplifying module and an output module. The bias module is coupled to the voltage source to provide a bias current and a reference current. The amplifying module is coupled to the bias module and the voltage source to amplify a first input signal and a second input signal to generate a first amplified signal and a second amplified signal according to the bias current and the reference current. The output module is coupled to the voltage source and the amplifying module to receive the first amplified signal and the second amplified signal to generate an output signal.

BRIEF DESCRIPTION OF THE DRAWINGS

The invention can be more fully understood by reading the subsequent detailed description and examples with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
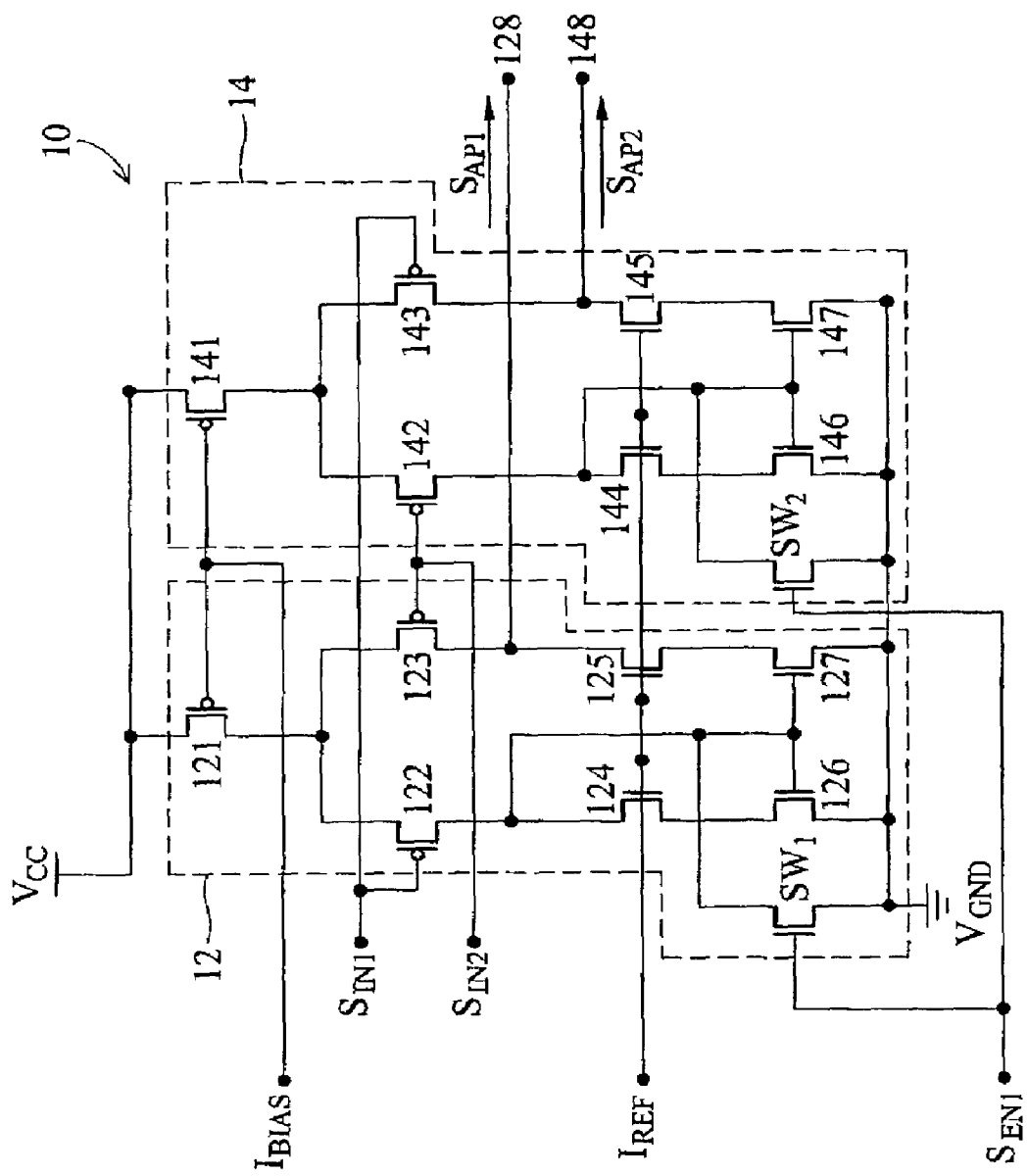
FIG. 1 shows an embodiment of an amplifier structure according to the invention.

FIG. 1 shows an embodiment of an amplifier structure according to the invention. An amplifier structure 10 comprises a voltage source $V_{CC}$, a first amplifying unit 12 and a second amplifying unit 14. The first amplifying unit 12 is coupled to the voltage source $V_{CC}$ to amplify a first input signal $S_{IN1}$ and a second input signal $S_{IN2}$ to generate a first amplified signal $S_{AP1}$ according to a bias current $I_{BIAS}$ and a reference current $I_{REF}$. The second amplifying unit 14 is coupled to the voltage source $V_{CC}$ and the first amplifying unit 12 to amplify the first input signal $S_{IN1}$ and the second input signal $S_{IN2}$ to generate a second amplified signal $S_{AP2}$ according to the bias current $I_{BIAS}$ and the reference current $I_{REF}$, wherein the amplifier generates an output signal (not shown) according to the first amplified signal $S_{AP1}$ and the second amplified signal $S_{AP2}$.

The first amplifying unit 12 comprises a first transistor 121, a second transistor 122, a third transistor 123, a fourth transistor 124, a fifth transistor 125, a sixth transistor 126, a seventh transistor 127, and a first output terminal 128. The first transistor 121 has a source coupled to the voltage source $V_{CC}$ and a gate to receive the bias current $I_{BIAS}$. The second transistor 122 has a source coupled to a drain of the first transistor 121, and a gate to receive the first input signal $S_{IN1}$. The third transistor 123 has a source coupled to the drain of the first transistor 121 and a gate to receive the second input signal $S_{IN2}$. The fourth transistor 124 has a drain coupled to a drain of the second transistor 122. The fifth transistor 125 has a drain coupled to a drain of the third transistor 123 and a gate coupled to a gate of the fourth transistor 124. The sixth transistor 126 has a drain coupled to the source of the fourth transistor 124 and a source coupled to a ground $V_{GND}$. The seventh transistor 127 has a drain coupled to the source of the fifth transistor 125, a gate coupled to a gate of the sixth transistor 126, and a source coupled to the ground $V_{GND}$. The first output terminal 128 is coupled between the drains of the third transistor 123 and the fifth transistor 125 to output the first amplified signal $S_{AP1}$.

The second amplifying unit 14 comprises an eighth transistor 141, a ninth transistor 142, a tenth transistor 143, an eleventh transistor 144, a twelfth transistor 145, a thirteenth transistor 146, a fourteenth transistor 147, and a second output terminal 148. The eighth transistor 141 has a source coupled to the voltage source $V_{CC}$ and a gate coupled to the gate of the first transistor 121. The ninth transistor 142 has a source coupled to a drain of the eighth transistor 141 and a gate to receive the second input signal $S_{IN2}$. The tenth transistor 143 has a source coupled to the drain of the eighth transistor 141 and a gate to receive the first input signal $S_{IN1}$. The eleventh transistor 144 has a drain coupled to a drain of the ninth transistor 142. The twelfth transistor 145 has a drain coupled to a drain of the tenth transistor 143 and a gate coupled to a gate of the eleventh transistor 144. The thirteenth transistor 146 has a drain coupled to the source of the eleventh transistor 144 and a source coupled to the ground $V_{GND}$. The fourteenth transistor 147 has a drain coupled to the source of the twelfth transistor 145, a gate coupled to a gate of the thirteenth transistor 146 and a source coupled to the ground $V_{GND}$. The second output terminal 148 is coupled between the drains of the tenth transistor 143 and the twelfth transistor 145 to output the second amplified signal $S_{AP2}$.

In one embodiment, the first transistor 121, the second transistor 122, the third transistor 123, the eighth transistor 141, the ninth transistor 142 and the tenth transistor 143 are PMOS transistors while the fourth transistor 124, the fifth transistor 125, the sixth transistor 126, the seventh transistor 127, the eleventh transistor 144, the twelfth transistor 145, the thirteenth transistor 146 and the fourteenth transistor 147 are NMOS transistors.

The first amplifying unit 12 further comprises a first switch SW1 having one end coupled between the drains of the second transistor 122 and the fourth transistor 124 and the other end coupled to the ground $V_{GND}$, selectively turned on or off according to a first control signal $S_{EN1}$. The second amplifying unit 14 further comprises a second switch SW2 having one end coupled between the drains of the ninth transistor 142 and the eleventh transistor 144 and the other end coupled to the ground $V_{GND}$, selectively turned on or off according to the first control signal $S_{EN1}$.

Figure 2:
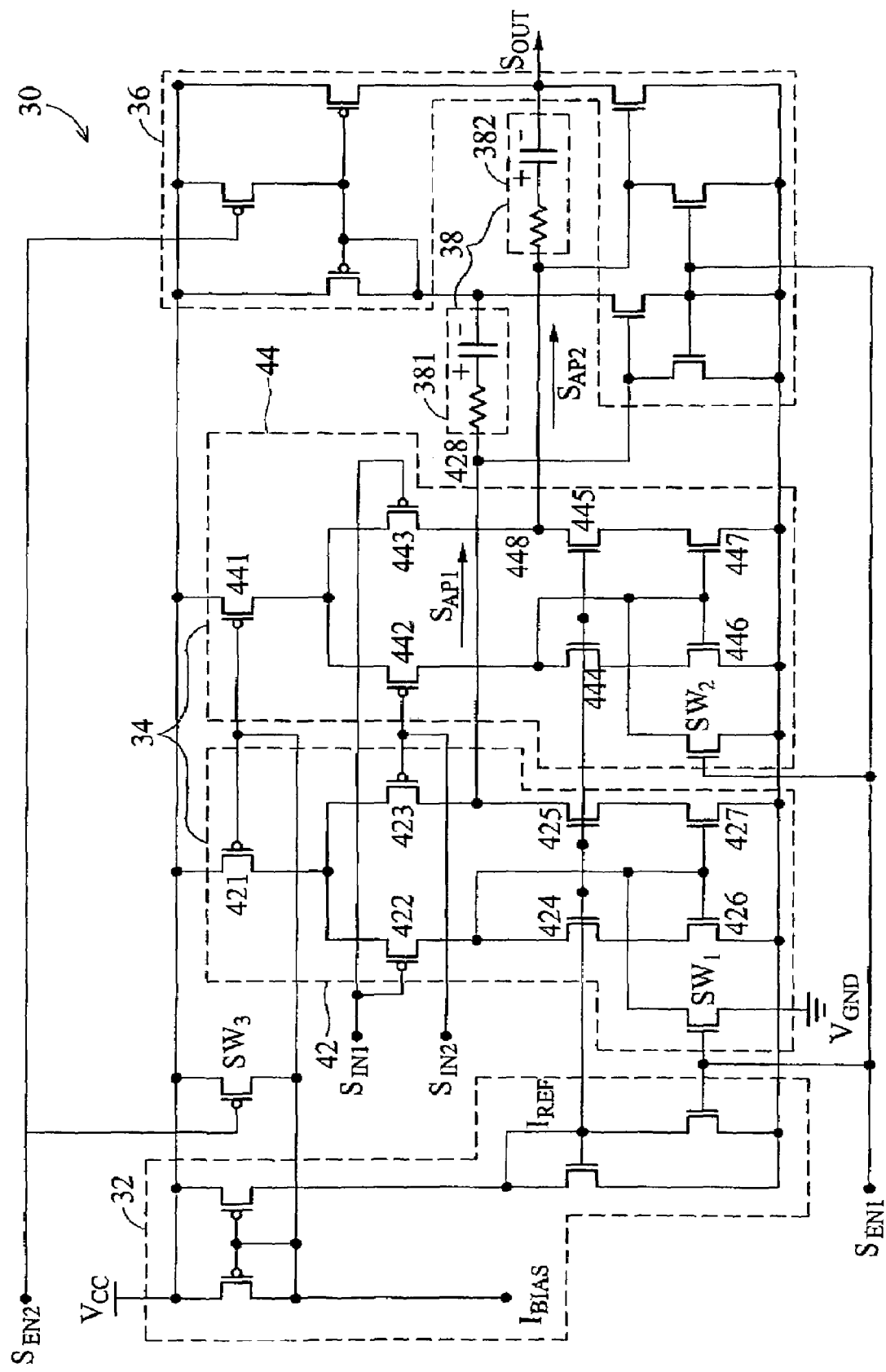
FIG. 2 shows an embodiment of an amplifier system according to the invention.

Please refer to FIG. 2. FIG. 2 shows an embodiment of an amplifier system according to the invention. As shown in FIG. 2, an amplifier system 30 comprises a voltage source $V_{CC}$, a bias module 32, an amplifying module 34 and an output module 36. The bias module 32 is coupled to the voltage source $V_{CC}$ to provide a bias current $I_{BIAS}$ and a reference current $I_{REF}$. The amplifying module 34 is coupled to the bias module 32 and the voltage source $V_{CC}$ to amplify a first input signal $S_{IN1}$ and a second input signal $S_{IN2}$ to generate a first amplified signal $S_{AP1}$ and a second amplified signal $S_{AP2}$ according to the bias current $I_{BIAS}$ and the reference current $I_{REF}$. The output module 36 is coupled to the voltage source $V_{CC}$ and the amplifying module 34 to receive the first amplified signal $S_{AP1}$ and the second amplified signal $S_{AP2}$ to generate an output signal $S_{OUT}$.

The amplifying module 34 comprises a first amplifying unit 42 and a second amplifying unit 44. The first amplifying unit 42 is coupled to the voltage source $V_{CC}$ to amplify the first input signal $S_{IN1}$ and the second input signal $S_{IN2}$ to generate the first amplified signal $S_{AP1}$ according to the bias current $I_{BIAS}$ and the reference current $I_{REF}$. The second amplifying unit 44 is coupled to the voltage source $V_{CC}$ and the first amplifying unit 42 to amplify the first input signal $S_{IN2}$ and the second input signal $S_{IN2}$ to generate the second amplified signal $S_{AP2}$ according to the bias current $I_{BIAS}$ and the reference current $I_{REF}$.

The first amplifying unit 42 comprises a first transistor 421, a second transistor 422, a third transistor 423, a fourth transistor 424, a fifth transistor 425, a sixth transistor 426, a seventh transistor 427 and a first output terminal 428. The first transistor 421 has a source coupled to the voltage source $V_{CC}$ and a gate to receive the bias current $I_{BIAS}$. The second transistor 422 has a source coupled to a drain of the first transistor 421, and a gate to receive the first input signal $S_{IN1}$. The third transistor 423 has a source coupled to the drain of the first transistor 421 and a gate to receive the second input signal $S_{IN2}$. The fourth transistor 424 has a drain coupled to a drain of the second transistor 422. The fifth transistor 425 has a drain coupled to a drain of the third transistor 423 and a gate coupled to a gate of the fourth transistor 424. The sixth transistor 426 has a drain coupled to the source of the fourth transistor 424 and a source coupled to a ground $V_{GND}$. The seventh transistor 427 has a drain coupled to the source of the fifth transistor 425, a gate coupled to a gate of the sixth transistor 426, and a source coupled to the ground $V_{GND}$. The first output terminal 428 is coupled between the drains of the third transistor 423 and the fifth transistor 425 to output the first amplified signal $S_{AP1}$.

The second amplifying unit 44 comprises an eighth transistor 441, a ninth transistor 442, a tenth transistor 443, an eleventh transistor 444, a twelfth transistor 445, a thirteenth transistor 446, a fourteenth transistor 447 and a second output terminal 448. The eighth transistor 441 has a source coupled to the voltage source $V_{CC}$ and a gate coupled to the gate of the first transistor 421. The ninth transistor 442 has a source coupled to a drain of the eighth transistor 441 and a gate to receive the second input signal $S_{IN2}$. The tenth transistor 443 has a source coupled to the drain of the eighth transistor 441 and a gate to receive the first input signal $S_{IN1}$. The eleventh transistor 444 has a drain coupled to a drain of the ninth transistor 442. The twelfth transistor 445 has a drain coupled to a drain of the tenth transistor 443 and a gate coupled to a gate of the eleventh transistor 444. The thirteenth transistor 446 has a drain coupled to the source of the eleventh transistor 444 and a source coupled to the ground $V_{GND}$. The fourteenth transistor 447 has a drain coupled to the source of the twelfth transistor 445, a gate coupled to a gate of the thirteenth transistor 446 and a source coupled to the ground $V_{GND}$. The second output terminal 448 is coupled between the drains of the tenth transistor 443 and the twelfth transistor 445 to output the second amplified signal $S_{AP2}$.

The first amplifying unit 42 further comprises a first switch $SW_1$ having one end coupled between the drains of the second transistor 422 and the fourth transistor 424 and the other end coupled to the ground $V_{GND}$, selectively turned on or off according to a first control signal $S_{EN1}$. The second amplifying unit 44 further comprises a second switch $SW_2$ having one end coupled between the drains of the ninth transistor 442 and the eleventh transistor 444 and the other end coupled to the ground $V_{GND}$, selectively turned on or off according to the first control signal $S_{EN1}$. The amplifying system 30 further comprises a third switch $SW_3$ coupled between the voltage source $V_{CC}$ and the bias current $I_{BIAS}$, selectively turned on or off according to a second control signal $S_{EN2}$.

The amplifying system 30 further comprise a compensation module 38 coupled between the amplifying module 34 and the output module 36 for performing phase compensation on the first amplified signal $S_{AP1}$ and the second amplified signal $S_{AP2}$.

The compensation module 38 comprises a first compensation unit 381 and a second compensation unit 382. The first compensation unit 382 is coupled between the first output terminal 428 and the output module 36 for performing phase compensation on the first amplified signal $S_{AP1}$. The second compensation unit 382 is coupled between the second output terminal 448 and the output module 36 for performing phase compensation on the second amplified signal $S_{AP2}$. Each of the first compensation unit 381 and the second compensation unit 382 comprises a resistor and a capacitor connected in series.

In an embodiment, the output module of the invention may be a double-end to single-end amplifier, although the disclosure is not limited thereto, an amplifier with double inputs and double outputs is equally applicable. It is to be understood that, although FIG. 2 is illustrated, the bias module of the invention may be any circuit that capable of providing a bias current and a reference circuit other than that shown in FIG. 2.

With the disclosed amplifying structure, which comprises a first amplifying unit and a second amplifying unit, the first input signal and the second input signal are amplified thereby respectively to generate a first amplified signal and a second amplified signal. The first amplified signal and the second amplified signal are then processed by the output module to generate an output signal so as to adjust the offset voltage effectively to overcome conventional amplifier problems caused by the offset voltage thereof.

While the invention has been described by way of example and in terms of preferred embodiment, it is to be understood that the invention is not limited thereto. To the contrary, it is intended to cover various modifications and similar arrangements (as would be apparent to the skilled in the art). Therefore, the scope of the appended claims should be accorded to the broadest interpretation so as to encompass all such modifications and similar arrangements.

What is claimed is:

1. An amplifier structure, comprising:
a voltage source;
a first amplifying unit electrically connected to the voltage source, amplifying a first input signal and a second input signal to generate a first amplified signal according to a bias current and a reference current, and comprising:
  a first transistor, having a source coupled to the voltage source and a gate to receive the bias current;
  a second transistor, having a source coupled to a drain of the first transistor and a gate to receive the first input signal;
  a third transistor, having a source coupled to the drain of the first transistor and a gate to receive the second input signal;
  a fourth transistor, having a drain coupled to a drain of the second transistor;
  a fifth transistor, having a drain coupled to a drain of the third transistor and a gate coupled to a gate of the fourth transistor;
  a sixth transistor, having a drain coupled to the source of the fourth transistor and a source coupled to a ground;
  a seventh transistor, having a drain coupled to the source of the fifth transistor, a gate coupled to a gate of the sixth transistor and a source coupled to the ground; and
  a first output terminal coupled between the drains of the third transistor and the fifth transistor to output the first amplifying signal; and
a second amplifying unit electrically connected to the voltage source and the first amplifying unit, amplifying the first input signal and the second input signal to generate a second amplified signal according to the bias current and the reference current,
wherein the amplifier generates an output signal according to the first amplified signal and the second amplified signal.

2. The amplifier structure as claimed in claim 1, wherein the second amplifying unit further comprises:
an eighth transistor, having a source coupled to the voltage source and a gate coupled to the gate of the first transistor;
a ninth transistor, having a source coupled to a drain of the eighth transistor and a gate to receive the second input signal;
a tenth transistor, having a source coupled to the drain of the eighth transistor and a gate to receive the first input signal;
an eleventh transistor, having a drain coupled to a drain of the ninth transistor;
a twelfth transistor, having a drain coupled to a drain of the tenth transistor and a gate coupled to a gate of the eleventh transistor;
a thirteenth transistor, having a drain coupled to the source of the eleventh transistor and a source coupled to the ground;
a fourteenth transistor, having a drain coupled to the source of the twelfth transistor, a gate coupled to a gate of the thirteenth transistor and a source coupled to the ground; and
a second output terminal coupled between the drains of the tenth transistor and the twelfth transistor to output the second amplified signal.

3. The amplifier structure as claimed in claim 1, wherein the first amplifying unit further comprises a first switch having one end coupled between the drains of the second transistor and the fourth transistor and the other end coupled to the ground, selectively turned on or off according to a first control signal.

4. The amplifier structure as claimed in claim 2, wherein the second amplifying unit further comprises a second switch having one end coupled between the drains of the ninth transistor and the eleventh transistor and the other end coupled to the ground, selectively turned on or off according to a first control signal.

5. The amplifier structure as claimed in claim 2, wherein the first transistor, the second transistor, the third transistor, the eighth transistor, the ninth transistor and the tenth transistor are PMOS transistors, and the fourth transistor, the fifth transistor, the sixth transistor, the seventh transistor, the eleventh transistor, the twelfth transistor, the thirteenth transistor and the fourteenth transistor are NMOS transistors.

6. An amplifier system, comprising:
a voltage source;
a bias module electrically connected to the voltage source, providing a bias current and a reference current;
an amplifying module electrically connected to the bias module and the voltage source, amplifying a first input signal and a second input signal to generate a first amplified signal and a second amplified signal according to the bias current and the reference current; and
an output module electrically connected to the voltage source and the amplifying module, receiving the first amplified signal and the second amplified signal to generate an output signal;
wherein the amplifying module further comprises:
  a first amplifying unit electrically connected to the voltage source, amplifying the first input signal and the second input signal to generate the first amplified signal according to the bias current and the reference current, and comprising:
    a first transistor, having a source coupled to the voltage source and a gate to receive the bias current;
    a second transistor, having a source coupled to a drain of the first transistor and a gate to receive the first input signal;
    a third transistor, having a source coupled to the drain of the first transistor and a gate to receive the second input signal;

a fourth transistor, having a drain coupled to a drain of the second transistor;

a fifth transistor, having a drain coupled to a drain of the third transistor and a gate coupled to a gate of the fourth transistor;

a sixth transistor, having a drain coupled to the source of the fourth transistor and a source coupled to a ground;

a seventh transistor, having a drain coupled to the source of the fifth transistor, a gate coupled to a gate of the sixth transistor and a source coupled to the ground; and a first output terminal coupled between the drains of the third transistor and the fifth transistor to output the first amplifying signal; and a second amplifying unit electrically connected to the voltage source and the first amplifying unit, amplifying the first input signal and the second input signal to generate the second amplified signal according to the bias current and the reference current.

7. The amplifier system as claimed in claim 6, wherein the first amplifying unit further comprises a first switch having one end coupled between the drains of the second transistor and the fourth transistor and the other end coupled to the ground, selectively turned on or off according to a first control signal.

8. The amplifier system as claimed in claim 6, wherein the second amplifying unit further comprises:

an eighth transistor, having a source coupled to the voltage source and a gate coupled to the gate of the first transistor;

a ninth transistor, having a source coupled to a drain of the eighth transistor and a gate to receive the second input signal;

a tenth transistor, having a source coupled to the drain of the eighth transistor and a gate to receive the first input signal;

an eleventh transistor, having a drain coupled to a drain of the ninth transistor;

a twelfth transistor, having a drain coupled to a drain of the tenth transistor and a gate coupled to a gate of the eleventh transistor;

a thirteenth transistor, having a drain coupled to the source of the eleventh transistor and a source coupled to the ground;

a fourteenth transistor, having a drain coupled to the source of the twelfth transistor, a gate coupled to a gate of the thirteenth transistor and a source coupled to the ground; and a second output terminal coupled between the drains of the tenth transistor and the twelfth transistor to output the second amplified signal.

9. The amplifier system as claimed in claim 8, wherein the first transistor, the second transistor, the third transistor, the eighth transistor, the ninth transistor and the tenth transistor are PMOS transistors, and the fourth transistor, the fifth transistor, the sixth transistor, the seventh transistor, the eleventh transistor, the twelfth transistor, the thirteenth transistor and the fourteenth transistor are NMOS transistors.

10. The amplifier system as claimed in claim 8, wherein the second amplifying unit further comprises a second switch having one end coupled between the drains of the ninth transistor and the eleventh transistor and the other end coupled to the ground, selectively turned on or off according to a first control signal.

11. The amplifier system as claimed in claim 6, wherein the amplifying system further comprises a third switch coupled between the voltage source and the bias current, selectively turned on or off according to a second control signal.

12. The amplifier system as claimed in claim 6, wherein amplifying system further comprises a compensation module coupled between the amplifying module and the output module for performing phase compensation on the first amplified signal and the second amplified signal.

13. The amplifier system as claimed in claim 12, wherein the compensation module further comprises:

a first compensation unit coupled between the first output terminal and the output module for performing phase compensation on the first amplifying signal; and a second compensation unit coupled between the second output terminal and the output module for performing phase compensation on the second amplified signal.

14. The amplifier system as claimed in claim 13, wherein the first compensation unit and the second compensation unit each comprise a resistor and a capacitor connected in series.

15. The amplifier system as claimed in claim 6, wherein the output module is a double-end to single-end amplifier.

* * * * *